United States Patent
Liao et al.

(10) Patent No.: US 9,800,397 B2
(45) Date of Patent: Oct. 24, 2017

(54) TOWER MOUNTED AMPLIFIER AND FILTER THEREOF

(71) Applicant: Telefonaktiebolaget L M Ericsson (Publ), Stockholm (SE)

(72) Inventors: Jichang Liao, Beijing (CN); Xiaoliang Du, Beijing (CN); Jiangyan Peng, Beijing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 84 days.

(21) Appl. No.: 14/782,653

(22) PCT Filed: Dec. 13, 2013

(86) PCT No.: PCT/CN2013/089403
§ 371 (c)(1),
(2) Date: Oct. 6, 2015

(87) PCT Pub. No.: WO2015/085585
PCT Pub. Date: Jun. 18, 2015

(65) Prior Publication Data
US 2016/0072618 A1    Mar. 10, 2016

(51) Int. Cl.
*H04L 5/14* (2006.01)
*H04B 1/04* (2006.01)
(Continued)

(52) U.S. Cl.
CPC ............. *H04L 5/1461* (2013.01); *H03F 3/19* (2013.01); *H04B 1/0458* (2013.01); *H04B 1/18* (2013.01);
(Continued)

(58) Field of Classification Search
None
See application file for complete search history.

(56) References Cited

U.S. PATENT DOCUMENTS 8,090,326 B1 * 1/2012 Wu .................. H04B 1/0057
455/553.1
2012/0169565 A1 * 7/2012 Morris, III ............. H03F 1/565
343/860
(Continued)

FOREIGN PATENT DOCUMENTS

CN        201307855 Y     9/2009
EP        2 660 975 A1    11/2013
(Continued)

OTHER PUBLICATIONS

International Search Report and Written Opinion dated Sep. 2, 2014 for International Application Serial No. PCT/CN2013/089403, International Filing Date—Dec. 13, 2013 consisting of 9-pages.

*Primary Examiner* — Min Jung
(74) *Attorney, Agent, or Firm* — Christopher & Weisberg, P.A.

(57) ABSTRACT

A tower mounted amplifier and a filter. The filter includes a transmission part having a first tunable portion and a reception part having a second tunable portion and a third tunable portion. The transmission part is coupled between a first port and a second port. The second tunable portion of the reception part is coupled between the first port and a third port, and the third tunable portion of the reception part is coupled between a fourth port and the second port. The first tunable portion is configured to work in a first frequency range different from a first pass band in which the second and third tunable portions are controlled to work when a radio frequency signal is to be transmitted from the first port to the second port, the radio frequency signal being rejected by the first tunable portion to the second port.

20 Claims, 6 Drawing Sheets

(51) Int. Cl.
*H04B 1/18* (2006.01)
*H04B 1/525* (2015.01)
*H03F 3/19* (2006.01)
*H04B 1/44* (2006.01)

(52) U.S. Cl.
CPC .............. *H04B 1/44* (2013.01); *H04B 1/525* (2013.01); *H03F 2200/171* (2013.01); *H03F 2200/294* (2013.01)

(56) References Cited

U.S. PATENT DOCUMENTS

| | | | |
|---|---|---|---|
| 2013/0215804 A1* | 8/2013 | Lu | H04J 3/06 370/280 |
| 2014/0153666 A1* | 6/2014 | McGowan | H04B 1/0483 375/295 |
| 2015/0038101 A1* | 2/2015 | Maxim | H03H 7/1775 455/340 |
| 2015/0065070 A1* | 3/2015 | Maxim | H03F 1/565 455/95 |

FOREIGN PATENT DOCUMENTS

| | | | |
|---|---|---|---|
| WO | 2009132044 A1 | 10/2009 | |
| WO | 2013075261 A1 | 5/2013 | |

* cited by examiner

"PRIOR ART"

TOWER MOUNTED AMPLIFIER AND FILTER THEREOF

TECHNICAL FIELD

Embodiments of the invention generally relate to tower mounted amplifiers (TMA) used in base stations, and specifically, to a TMA for use in a Time Division Duplex (TDD) communication system and a filter of the TMA.

BACKGROUND

TMAs have been recently gaining relevance in the cellular network industry. Basically, a TMA is a device which comprises a reception and transmission filter and a low noise amplifier (LNA). Such devices, usually installed directly behind the base station antennas, amplify the received signals at the top of the base station antenna mast so as to improve the overall system sensibility of a mobile network base station. By amplifying the signals as near as possible to the antenna, the TMA compensates the cable and connector losses between the antenna and the input of the base station.

In a TDD communication system, uplink and downlink transmissions use a same frequency. Therefore, in a typical TMA equipment, for example as described in a U.S. patent application Ser. No. 10/976,841, there may be a risk for the LNA included in the TMA to withstand a high power signal reflected from an antenna port due to the mismatch of the antenna port. The reflected energy is usually proportional to the degree of the mismatch. The more the antenna port is mismatched, the more energy may be reflected from the antenna port to the LNA. Especially, when the antenna port is open, all transmitting energy may be reflected to the LNA, which is vital and may cause the LNA to be broken. Therefore, protection for the LNA in a TMA is critical in a TDD communication system.

An existing solution as shown in FIG. 1 employs circulators to separate receiving (Rx) and transmitting (Tx) signals. In order to protect the LNA from damaging by the possibly returned energy during a Tx slot, a single pole double throw (SPDT) switch is used before it.

However, there exist some disadvantages with the existing solution. For example, since insertion loss (IL) of a high power TR (Tx-Rx) switch, such as the SPDT switch, is generally above 0.5 dB and the IL of a circulator is typically 0.3 dB, the total IL except for the IL introduced by an RF filter on the Rx path is up to 1.1 dB. Additionally, the dimension of a TR switch is large, for example, about 45 mm×5 mm for a 40 W system, which may result in a bulky TMA.

SUMMARY

Various embodiments of the invention aim at addressing at least part of the above problems and disadvantages. Other features and advantages of embodiments of the invention will also be understood from the following description of specific embodiments when read in conjunction with the accompanying drawings, which illustrate, by way of example, the principles of embodiments of the invention.

Various aspects of embodiments of the invention are set forth in the appended claims and summarized in this section. It shall be understood that the protection scope of the invention is limited by the appended claims.

In a first aspect of the invention, a tower mounted amplifier filter is provided. The tower mounted amplifier filter comprises: four ports; a transmission part comprising a first tunable portion; and a reception part comprising a second tunable portion and a third tunable portion. The transmission part is coupled between a first port and a second port. The second tunable portion of the reception part is coupled between the first port and a third port; and the third tunable portion of the reception part is coupled between a fourth port and the second port. The first tunable portion is configured to work in a first frequency range different from a first pass band in which the second and third tunable portions are controlled to work when an RF signal is to be transmitted from the first port to the second port, such that the RF signal is rejected by the first tunable portion to the second port. The second and third tunable portions are configured to work respectively in a second frequency range and a third frequency range different from a second pass band in which the first tunable portion is controlled to work when the RF signal is to be transmitted from the second port to the first port, such that the RF signal is rejected by the second tunable portion to the third port and rejected by the third tunable portion to the fourth port.

In some embodiments, at least one of the transmission part and the reception part may further comprise at least one fixed portion.

In some embodiments, the tower mounted amplifier filter may comprise a plurality of cavities. Each of the first tunable portion, the second tunable portion, and the third tunable portion may comprise at least one tunable cavity.

In some embodiments, the tower mounted amplifier filter may further comprise at least one common cavity that is shared by the transmission part and the reception part, and coupled to the first port.

In some embodiments, the first frequency range may be non-overlapping with the first pass band; and/or each of the second frequency range and the third frequency range may be non-overlapping with the second pass band.

In some embodiments, the first tunable portion may be tuned by a first tuning circuit separately from tuning of the second tunable portion and the third tunable portion by a second tuning circuit.

In some embodiments, each of the first tuning circuit and the second tuning circuit may comprise at least one PIN diode.

In a second aspect of the invention, a tower mounted amplifier is provided. The tower mounted amplifier comprises a filter and a lower noise amplifier. The filter comprises four ports, a transmission part comprising a first tunable portion, and a reception part comprising a second tunable portion and a third tunable portion. The transmission part is coupled between a first port and a second port, the second tunable portion of the reception part is coupled between the first port and a third port, and the third tunable portion of the reception part is coupled between a fourth port and the second port. The low noise amplifier is connected between the third port and the fourth port. The first tunable portion is configured to work in a first frequency range different from a first pass band in which the second and third tunable portions are controlled to work when an RF signal is to be transmitted from the first port to the second port, such that the RF signal is rejected by the first tunable portion to the second port. The second and third tunable portions are configured to work respectively in a second frequency range and a third frequency range different from a second pass band in which the first tunable portion is controlled to work when the RF signal is to be transmitted from the second port to the first port, such that the RF signal is rejected by the second tunable portion and third tunable portion to the low noise amplifier.

According to particular embodiments in relation to the tower mounted amplifier and the tower mounted amplifier filter as described in this specification, the LNA included in the tower mounted amplifier can be effectively protected by the tower mounted amplifier filter, while keeping lower insertion loss. Further, a smaller dimension may be achieved.

Other features and advantages of the embodiments of the present invention will become apparent from the following description of specific embodiments when read in conjunction with the accompanying drawings, which illustrate, by way of example, the principles of embodiments of the present invention.

BRIEF DESCRIPTION OF THE DRAWINGS

The above and other aspects, features, and benefits of various embodiments of the invention will become more fully apparent, by way of example, from the following detailed description and the accompanying drawings, in which like reference numerals refer to the same or similar elements:

FIG. 4 illustrates an example implementation of the filter 200 of FIG. 2, wherein

DETAILED DESCRIPTION

Figure 1:
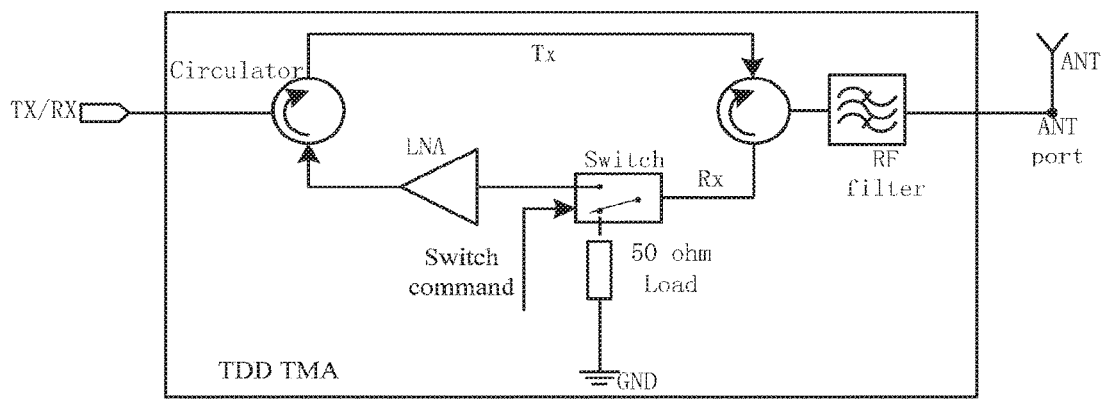
FIG. 1 illustrates a typical TDD TMA in a prior art.

In the following description, numerous specific details are set forth. However, it shall be understood that embodiments of the invention may be practiced without these specific details. In some instances, well-known circuits, structures and techniques have not been shown in detail in order not to obscure the understanding of this description. It will be appreciated, however, by one skilled in the art that the invention may be practiced without such specific details. In other instances, control structures, gate level circuits, and control signal flows have not been shown in detail in order not to obscure the invention. Those of ordinary skills in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that, although the terms "first", "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

In the following description and claims, the terms "coupled" and "connected," along with their derivatives, may be used. It should be understood that these terms are not intended as synonyms for each other. "Coupled", along with its derivatives, can be used to indicate that two or more elements within a same device, e.g. a filter, may or may not be in direct physical or electrical contact with each other. "Connected", along with its derivatives, can be used to indicate that two or more devices are externally connected to each other. It shall be understood that when a device is referred to as being "connected" to another device, it can be directly connected to the other device or intervening devices may be present.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, the term "cavity" will be used. It should be understood that the term "cavity" used therein not only comprise a mechanical structure of a cavity but also comprise a resonator included in the cavity. Thus, for example, "tuning a cavity" indicates that the resonator in the cavity is tuned so as to shift a resonant frequency of the cavity. The term "tunable" may be used for describing a cavity or a portion. It should be understood that the term "tunable" used therein means that the cavity or the portion can be electrically tuned in response to a control signal, unless the context clearly indicates otherwise.

Figure 2:
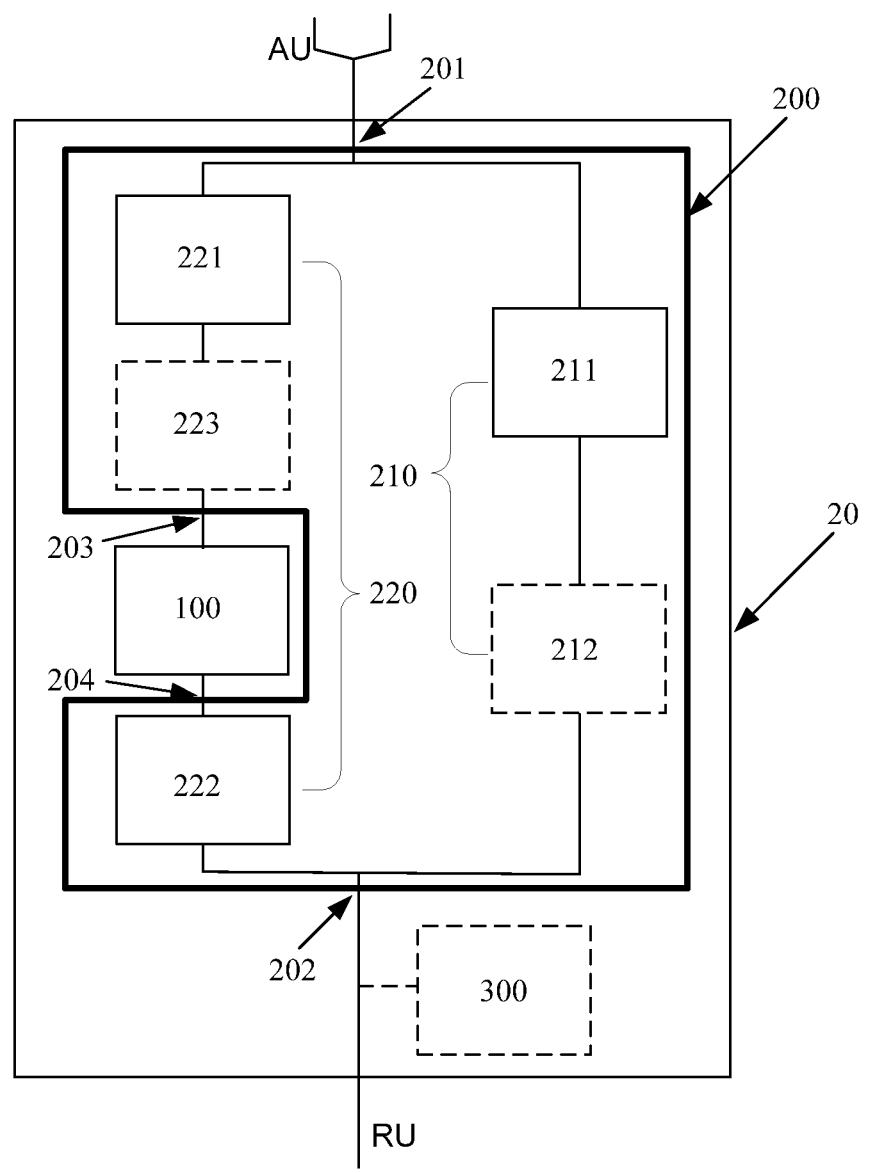
FIG. 2 illustrates a simplified structure of a TMA used in a TDD communication system according to one embodiment of the invention.

Reference is first made to FIG. 2, in which a simplified structure of a TMA 20 used at a base station antenna mast in a TDD communication system (which will be abbreviated as a TDD TMA hereafter) according to one embodiment of the invention is illustrated.

The illustrated TDD TMA 20 comprises an amplifier 100, such as a LNA and a filter 200. The filter 200 comprises four ports 201~204. A first port 201 is configured to connect to an external device, such as an antenna unit (AU) of a base station. A second port 202 is configured to connect to another external device, such as a radio unit (RU) of the base station. A third port 203 and a fourth port 204 are configured to connect to the amplifier 100.

The filter 200 also comprises: a transmission part 210 which functions as the Tx path when an RF signal is to be transmitted from the second port 202 to the first port 201, for example, when the radio unit is transmitting the RF signal via the antenna unit, i.e. in a Tx slot; and a reception part 220 which functions as the Rx path when an RF signal is to be transmitted from the first port 201 to the second port 202, for example, when the radio unit is receiving the RF signal via the antenna unit, i.e. in an Rx slot. The transmission part 210 further comprises a first tunable portion 211 whose work band may be controlled by a tuning circuit (e.g. a first tuning circuit 412 as described later with respect to FIG. 4). The reception part 220 further comprises a second tunable portion 221 and a third tunable portion 222 whose work bands may be controlled by another tuning circuit (e.g. a second tuning circuit 424 as described later with respect to FIG. 4).

As illustrated in FIG. 2, the transmission part 210 is coupled between the first port 201 and the second port 202. The second tunable portion 221 of the reception part 220 is coupled between the first port 201 and the third port 203, while the third tunable portion 222 of the reception part 220 is coupled between the fourth port 204 and the second port 202.

The tuning circuits as mentioned above may be connected or integrated to a control circuit (not shown) that may preferably comprise an envelop detector 300. The envelope detector 300 may generate a control signal for triggering the tuning circuits to tune the first, second and third tunable portions of the filter 200 by detecting the envelope of an RF signal to be transmitted through the filter 200, so as to ensure that the RF signal can take a correct path. For example, when the envelop detector 300 detects a large envelope, which means that there is an RF signal to be transmitted from the radio unit, i.e. in a TX slot of the base station, the control circuit will generate a control signal for triggering the tuning circuits to tune the first tunable portion 211 to work in the pass band and to tune the second and third tuning portions 221, 222 to reject the RF signal so as to protect the LNA 100 from any possible damage. By contrast, when the envelop detector 300 detects a small envelope, which means that there is an RF signal received via the antenna unit, i.e. in an RX slot, the control circuit will generate a control signal for triggering the tuning circuits to tune the first tunable portion 211 to reject the RF signal and to tune the second and third tuning portions 221, 222 to work in the pass band.

In particular, when an RF signal is to be transmitted from the first port 201 to the second port 202, for example, when the RF signal is received via the first port 201 from the antenna unit, i.e. in an Rx slot, the first tunable portion 211 is configured to work in a first frequency range different from a pass band for the RF signal (i.e. a first pass band) in which the second and third tunable portions 221, 222 are controlled to work, such that the RF signal is rejected by the first tunable portion 211 to the second port 202. With such a configuration, most or all energy of the RF signal received via the antenna unit may enter the second tunable portion 221 of the reception part 220 and then be received and amplified by the amplifier 100. This configuration may reduce the insertion loss introduced by the filter 200 on the receiving path from the antenna unit to the radio unit of a base station as low as possible.

When an RF signal is to be transmitted from the second port 202 to the first port 201, for example, when the RF signal is transmitted from the radio unit, i.e. in a Tx slot, the second and third tunable portions 221, 222 are configured to work respectively in a second frequency range and a third frequency range different from a pass band for the RF signal (i.e. a second pass band) in which the first tunable portion 211 is controlled to work, such that the RF signal is rejected by the second tunable portion 221 and third tunable portion 222 to the amplifier 100. Generally, the second frequency range and the third frequency range are configured to be the same, however they may be different with a particular configuration. With such a configuration, even though the RF signal to be transmitted is reflected, for example due to the antenna port mismatch, the reflected energy from the antenna port will not enter the second tunable portion 221 and then reach the amplifier 100. Therefore, the amplifier 100 can be protected from damaging by the possible transient high reflected energy. Moreover, due to the isolation introduced by the third tunable portion 222, most or all energy of the RF signal to be transmitted from the radio unit may enter the transmission part 210 and then be transmitted via the antenna unit, and thus the LNA can be protected from the high energy of the RF signal to be transmitted from the second port 202.

In a preferable embodiment, the reception part 220 may comprise at least one fixed portion 223 as illustrated in FIG. 2. Alternatively or additionally, the transmission part 210 may comprise at least one fixed portion 212, depending on practical performance requirements in particular applications or implementations of the invention. The inclusion of the fixed portion(s) may increase out of band rejection of the reception part and/or transmission part. It shall be understood that although the fixed portion 212 is shown to be closer to the second port 202, it may be closer to the first port 201. Similarly, the position of the fixed portion 223 in the reception part 220 is not limited to the illustration. In such an embodiment, the fixed portions 212 and 223 may be configured, for example by mechanically adjusting, to always work in the pass band for the RF signal to be transmitted through the filter 200 (which will be referred to as a fixed pass band hereafter).

Generally, the aforesaid first pass band and the second pass band and the fixed pass band (if present), are configured to be within a same TDD band as specified by communication standards or protocols. They may have at least one overlapping part that covers the frequency of the RF signal to be transmitted or received. However, these three pass bands may not necessarily be identical. For example, the first pass band may be wider or narrower than the second pass band or vice versa.

For an Rx slot, the first frequency range of the first tunable portion 211 may be partly overlapping with the first pass band of the second tunable portion 221 and the third tunable portion 222, as long as the energy of the RF signal received from the first port 201 that can pass through the first tunable portion 211 is sufficiently low so as not to distract much energy from the received signal and thus not to significantly affect the noise figure of the received RF signal at the radio unit.

For a Tx slot, each of the second frequency range of the second tunable portion 221 and the third frequency range of the third tunable portion 222 may be partly overlapping with the second pass band of the first tunable portion 211, as long as the energy of the RF signal to be transmitted that can pass through the second tunable portion 221 or the third tunable portion 222 is sufficiently low so as not possible to damage the amplifier 100.

Preferably, the first frequency range of the first tunable portion 211 may be non-overlapping with the first pass band of the second tunable portion 221 and the third tunable portion 222. Alternatively or additionally, each of the second frequency range of the second tunable portion 221 and the third frequency range of the third tunable portion 222 may be non-overlapping with the second pass band of the first tunable portion 211. Further preferably, a gap between the first frequency range of the first tunable portion 211 and the first pass band of the second tunable portion 221 and the third tunable portion 222 as well as the gap between each of the second frequency range of the second tunable portion 221 and the third frequency range of the third tunable portion 222 with the second pass band of the first tunable portion 211 may be configured to be as large as possible.

In one embodiment, the filter 200 may be implemented as a tunable cavity filter, although other types of filters, such as a LC filter, surface acoustic wave (SAW) filter, bulk acoustic wave (BAW) filter and waveguide filter are also possible.

Advantages of cavity filters at least include high power handling ability, low insertion loss and a high Q factor, which enable cavity filters to be popularly used in high power communication equipments, such as in a base station.

In this embodiment, the filter 200 may comprise a plurality of cavities. For example, each of the first tunable portion 211, the second tunable portion 221 and the third tunable portion 222 of the filter 200 may comprise at least one cavity that is tunable, depending on isolation or rejection requirements. If the fixed portion 212 or 223 is present, it may comprise at least one fixed cavity. Generally, more fixed cavities may provide better out of band rejection, but may also increase the insertion loss and manufacturing costs. More tunable cavities may provide higher isolation between the transmission part and the reception part, but may also increase complexity of the filter structure and manufacturing costs. Therefore, under certain performance requirements on the isolation and out of band rejection, the number of cavities comprised in either the tunable portion or the fixed portion (if any) is preferably configured to be as small as possible.

Hereafter, descriptions will be made with reference to FIGS. 3-5 to detail the structure and operations of the filter 200 when it is implemented as a tunable or partly tunable cavity filter. The term "partly tunable" used herein means that some portions of the filter (e.g. the first, second and third tunable portions 211, 221 and 222 as described above) can be electrically tuned while at least one portion of the filter (e.g. the fixed portion 212 or 223 as described above) cannot be electrically tuned.

Figure 3:
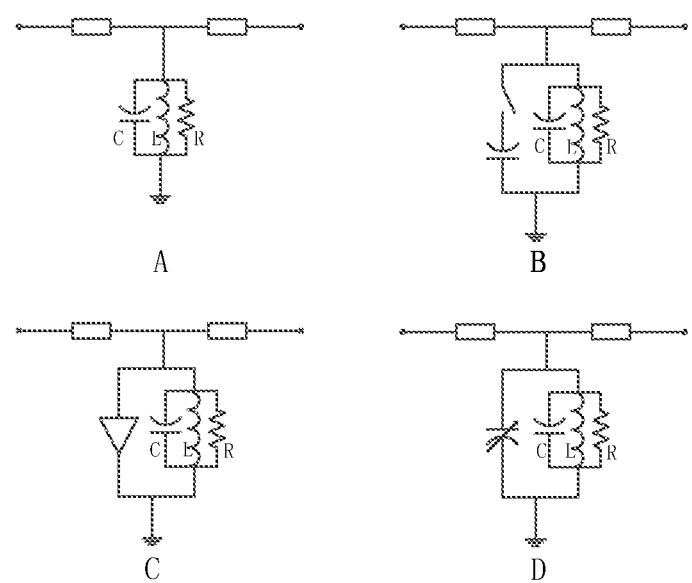
FIG. 3A illustrates an equivalent circuit model of a general filter cavity and FIG. 3B-3D respectively illustrates different example methods for tuning a filter cavity.

The methods for tuning a filter cavity are firstly introduced with reference to FIG. 3. FIG. 3A illustrates an equivalent circuit model of a general filter cavity and FIG. 3B-D respectively illustrates different example methods for tuning a filter cavity.

Generally, a PIN diode, varactor, microelectromechanical systems (MEMS) switch or combination of a switch and capacitor may be used to tune a filter cavity.

FIG. 3B illustrates employing the combination of a switch, such as the MEMS switch or PIN diode switch, and a capacitor to tune a filter cavity. FIG. 3C illustrates employing the PIN diode to tune a filter cavity. FIG. 3D illustrates employing the varactor to tune a filter cavity. The combination of a switch and a capacitor or the varactor is often used for cavity tuning in a FDD system since it can offer precise controlling of the resonant frequency of a cavity so as to accommodate different frequencies of associated downlink and uplink RF signals in the FDD system.

However, in a TDD system, downlink and uplink transmissions use the same frequency, and it is not necessary to precisely tune a filter cavity(-ies) used for rejecting an RF signal to work in a specific frequency range and meanwhile have a high Q factor. Q factor characterizes a resonator's or cavity's bandwidth relative to its center frequency. Higher Q indicates a lower rate of energy loss relative to the stored energy of the resonator or cavity. Usually, a cavity of a higher Q factor will introduce less insertion loss. Therefore, for the TDD TMA filter according to embodiments of the present invention, the first tunable portion 211 is not required to have a high Q value in an Rx slot, as long as its work band can be shifted away from the pass band of the second and third tunable portions 221, 222. Similarly, the second and third tunable portions 221, 222 are not required to have a high Q value in a Tx slot, as long as their work bands can be shifted away from the pass band of the first tunable portion 211. Therefore, more interests are focused on how to improve isolation performance of the three tunable portions by shifting resonant frequencies of the corresponding cavities included therein when they work for rejecting RF signals and also on how to improve Q factors of the three tunable portions when they work in respective pass bands (e.g. the first and second pass bands).

In this case, a PIN diode may be preferably selected for tuning the resonant frequency of a filter cavity, since the PIN diode can offer faster switching performance relative to other elements, and more importantly, it may have the least impact on the Q factor of a filter cavity when it is in an OFF state.

In particular, a PIN diode operating in an ON state may be equivalently regarded as a small resistor R1 (e.g. about several ohms) and the PIN diode operating in the OFF state may be equivalently regarded as a capacitor connected in parallel with a big resistor R2 (e.g. about several Mega ohms). The resistance exhibited by the equivalent resistor of a PIN diode will have a significant impact on the Q factor of the corresponding cavity tuned by that PIN diode. As mentioned above, for a filter cavity or a tunable portion working in the pass band, more interests are focused on its Q factor. According to some simulation results, it has been known that the larger reverse resistor of a PIN diode (e.g. the resistor R2 of the PIN diode operating in the OFF state) may result in less impact on the Q factor of the cavity tuned by that PIN diode and consequently, have less impact on the insertion loss. By contrast, for a filter cavity working for rejecting an RF signal, more interests are focused on how much isolation it can provide instead of its Q factor. According to some simulation results, it has been known that the smaller forward resistor of a PIN diode (e.g. the resistor R1 of the PIN diode operating in the ON state) may shift the resonant frequency of the cavity tuned by it farther. Therefore, an appropriate PIN diode can effectively control a filter cavity to either pass an RF signal through with a high Q value or reject the RF signal with high isolation.

In one embodiment, two PIN diodes may be disposed respectively on both sides of the amplifier 100 to provide additional isolation. That is, one PIN diode may be disposed between the third port 203 and the amplifier 100 and the other PIN diode may be disposed between the fourth port 204 and the amplifier 100. Usually, the isolation provided by one PIN diode is less than the isolation provided by one cavity. Thus, for example, in a case where one cavity cannot provide enough isolation for the amplifier 100 but two cavities are not necessary, a PIN diode may be used instead to contribute additional isolation.

Figure 4A:
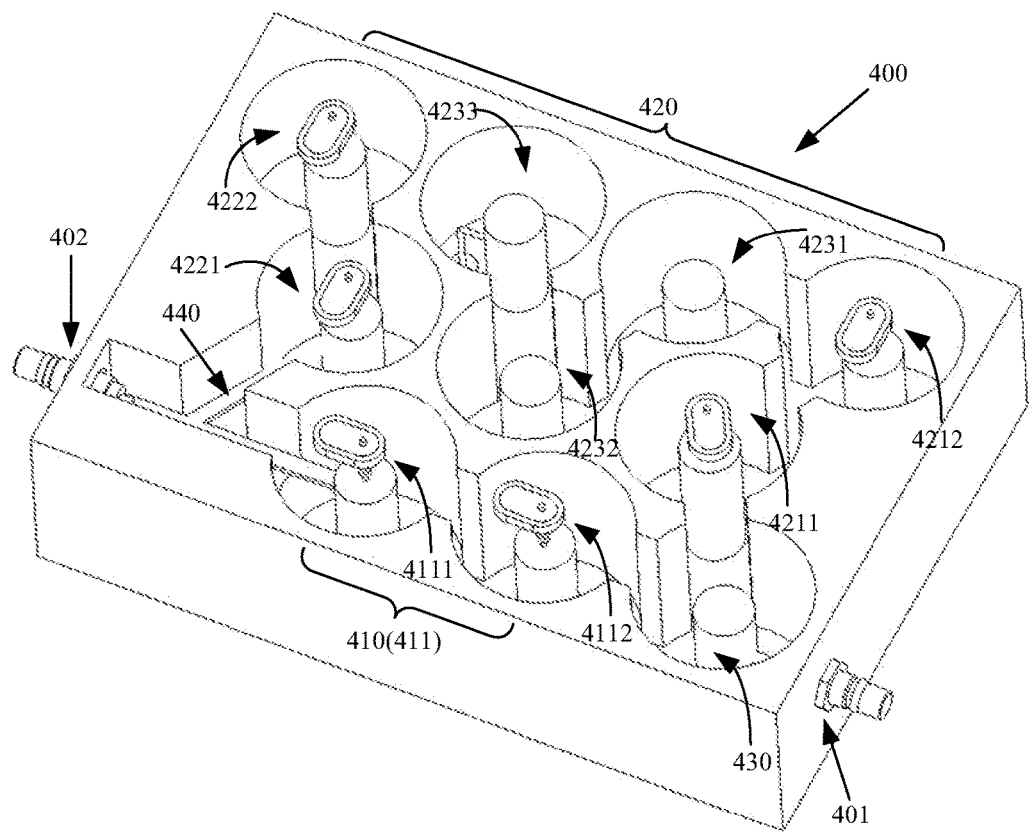
FIG. 4A shows a 3D structure of the filter.
Figure 4B:
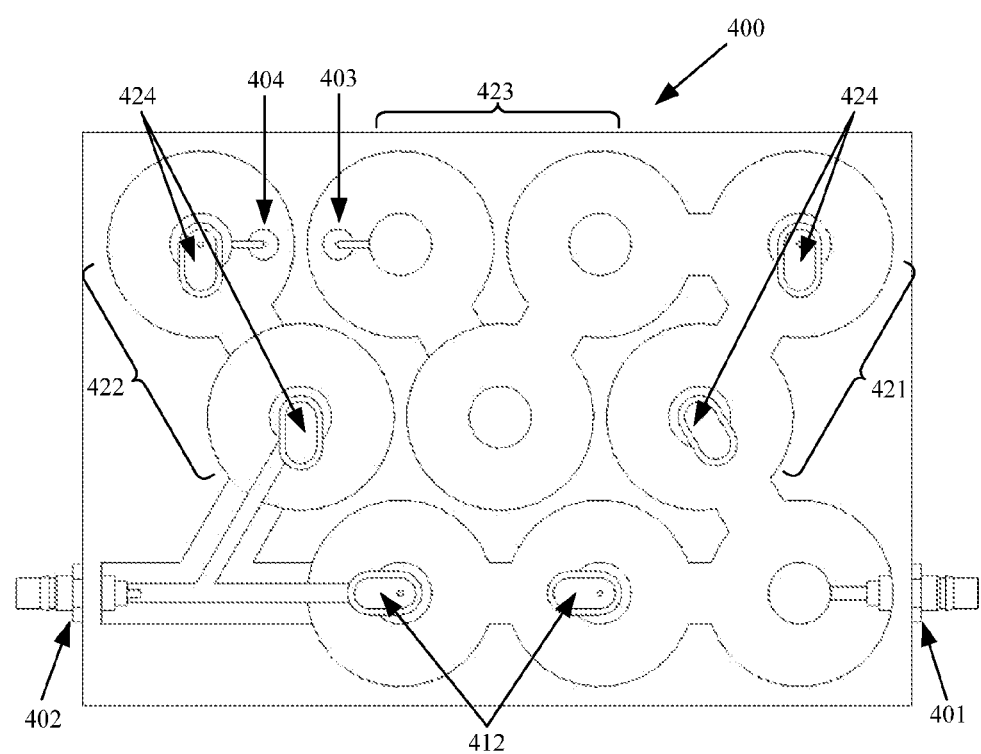
FIG. 4B shows a top view of the filter.
Figure 4C:
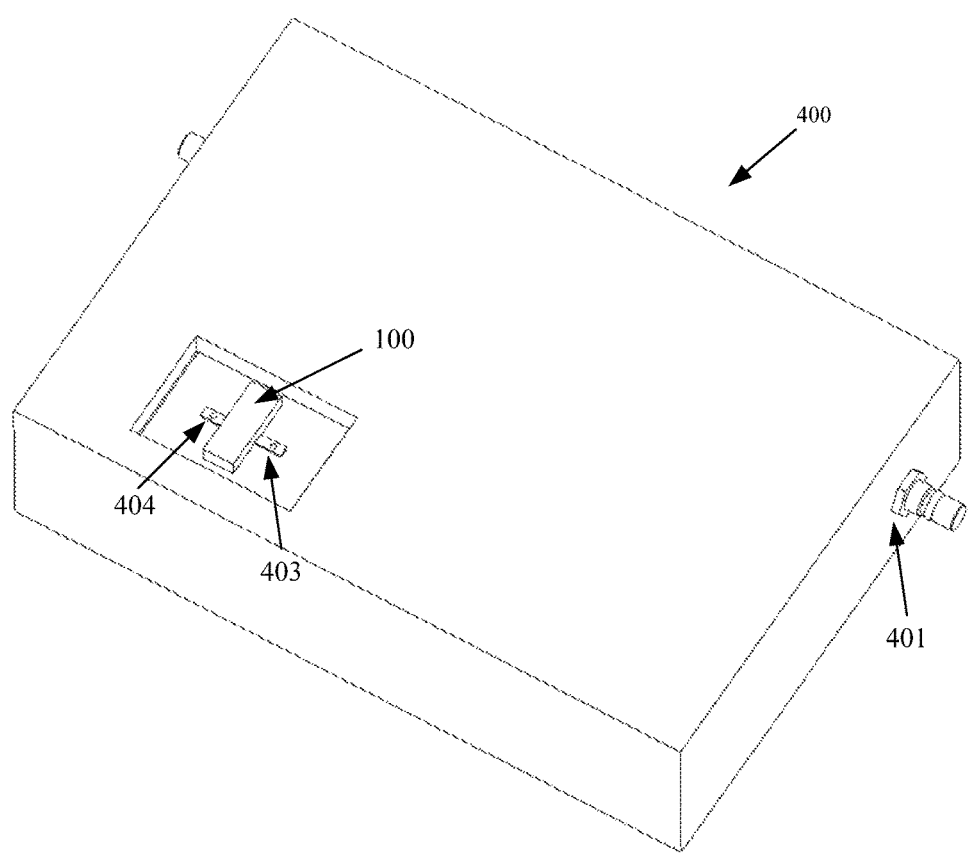
FIG. 4C shows a bottom view of the filter.

FIG. 4 illustrates an example implementation of the filter 200 of FIG. 2, which is implemented as a partly tunable cavity filter 400, wherein FIG. 4A shows a 3D structure of the filter 400; FIG. 4B shows a top view of the filter 400; and FIG. 4C shows a bottom view of the filter 400 with an amplifier 100 being connected thereto.

As illustrated, the filter 400 comprises a plurality of cavities. Each of the cavities comprises a metal resonator which may be mechanically tuned before the filter 400 starts operating and then electrically tuned when the filter 400 is in operation.

The filter 400 comprises four ports 401~404. The cavities 4111, 4112 with a first tuning circuit 412 may constitute a transmission part 410 that is coupled between a first port 401 and a second port 402. The cavities 4211, 4212, 4221, 4222 and 4231~4233 with a second tuning circuit 424 may constitute a reception part 420 that is coupled between the first port 401 and the second port 402. Although the second tuning circuit 424 is depicted herein as a single circuit, it may be implemented as two individual tuning circuits which are controlled by the same control circuit. As illustrated, the cavities 4111, 4112 comprised in the transmission part 410 are tunable by the first tuning circuit 412 and constitute the first tunable portion 411. The cavities 4211, 4212 comprised in the reception part 420 are tunable by the second tuning circuit 424 and constitute the second tunable portion 421. Two cavities 4221, 4222 comprised in the reception part 420 are also tunable by the second tuning circuit 424 and constitute the third tunable portion 422. The cavities 4231~4233 comprised in the reception part 420 are fixed and constitute the fixed portion 423. The second tunable portion 421 is coupled between the first port 401 and the third port 403 while the third tunable portion 422 is coupled between the fourth port 404 and the second port 402.

It shall be understood that the illustrated filter 400 is only a preferable and example implementation, the structure of the TDD TMA filter according to embodiments of the present invention is not limited to the specific structure. Thus, the number of the tunable cavities comprised in each tunable portion or the number of the fixed cavities comprised in the fixed portion is not limited to the number as illustrated in FIG. 4. These numbers may be varied according to practical performance requirements.

In FIG. 4A, on resonators of cavities 4111 and 4112 are connected the first tuning circuit 412 for electrically tuning resonant frequencies of the corresponding cavities, and on resonators of cavities 4211, 4212, 4221, and 4222 are connected the second tuning circuit 424. These tuning circuits 412, 424 are shown as consisting of a few small PCB boards that may be connected to a control circuit (not shown). It shall be noted that while the tuning circuits are shown to be embodied separately from the control circuit, it may also be integrated into the control circuit. Each of the tuning circuits may comprise at least one selected from a group consisting of a PIN diode, varactor diode, MEMS switch or combination of a switch and a capacitor. Preferably, each of the tuning circuits may comprise at least one PIN diode. Further preferably, the number of the PIN diodes comprised in each of the tuning circuits may be equal to the number of the cavities included in the corresponding tunable portion.

In the illustrated embodiment, the filter 400 may comprise a common cavity 430 whose inner resonator is directly coupled to the first port 401. The common cavity 430 is configured to divide the energy of an RF signal input from the first port 401 into a proper part or converge the energy of an RF signal from the transmission/reception part to the first port 401. However, it shall be understood that, in other embodiments, other known elements for dividing or converging a signal, such as a sheet metal part 440 as illustrated in FIG. 4 may be used instead of the common cavity 430. Similarly, the sheet metal part 440 may also be replaced with a common cavity.

In operation, when the filter 400 is used for filtering an RF signal to be transmitted from the first port 401 to the second port 402, a control signal from the control circuit may trigger the tuning circuit 424 to tune the cavities 4211, 4212, 4221 and 4222, i.e. the second tunable portion 421 and the third tunable portion 422, to work in the pass band, for example by switching OFF the PIN diodes comprised therein and meanwhile trigger the tuning circuit 412 to shift the resonant frequencies of the cavities 4111, 4112, i.e. the first tunable portion 411, away from the pass band, for example by switching ON the PIN diodes comprised therein. Thus, the RF signal to be transmitted may flow into the port 401 of the filter 400, then into the common cavity 430 and each of the series of cavities 4211, 4212, 4231~4233 and then out from the third port 403 for amplification by the amplifier connected to the third port 403. Then, the amplified RF signal may enter the cavities 4221, 4222 and out from the second port 402 for further transmission, for example to the radio unit.

Similarly, when the filter 400 is used for filtering an RF signal to be transmitted form the second port 402 to the first port 401, a control signal from the control circuit may trigger the tuning circuit 412 to tune the cavities 4111, 4112, i.e. the first tunable portion 411, to work in the pass band for example by switching OFF the PIN diodes comprised therein and meanwhile trigger the tuning circuit 424 to shift the resonant frequencies of the cavities 4211, 4212, 4221, 4222, i.e. the second tunable portion 421 and the third tunable portion 422, away from the pass band, for example by switching ON the PIN diodes comprised therein. Thus, the RF signal to be transmitted may flow into the port 402 of the filter 400, then into each of the series of cavities 4111, 4112, 430 and then out from the port 401 for transmission, for example via the antenna unit connected to the first port 401.

While the invention has been described in terms of several embodiments, those skilled in the art will recognize that the invention is not limited to the embodiments described, and can be practiced with modification and alteration within the disclosure and scope of the appended claims. The description is thus to be regarded as illustrative instead of limiting.

What is claimed is:

1. A tower mounted amplifier filter, comprising:
   a transmission part comprising a first tunable portion configured to operate in a first frequency range; and
   a reception part comprising a second tunable portion configured to operate in a second frequency range and a third tunable portion configured to operate in a third frequency range;
   a first port configured to connect to an external device;
   a second port configured to connect to another external device;
   a third port and a fourth port each configured to connect to an amplifier;
   the transmission part being coupled between the first port and the second port;
   the second tunable portion of the reception part being coupled between the first port and third port;
   the third tunable portion of the reception part being coupled between the fourth port and second port;
   the first tunable portion being configured to operate in a first frequency range different from a first pass band in which the second and third tunable portions are controlled to operate when a radio frequency signal is to be transmitted from the first port to the second port, such that the radio frequency signal is rejected by the first tunable portion; and
   the second and third tunable portions being configured to operate respectively in a second frequency range and a third frequency range different from a second pass band in which the first tunable portion is controlled to operate when the radio frequency signal is to be transmitted from the second port to the first port, such that the radio frequency signal is rejected by the second tunable portion and rejected by the third tunable portion.

2. The tower mounted amplifier filter according to claim 1, wherein at least one of the transmission part and the reception part further comprises at least one fixed portion that cannot be electrically tuned.

3. The tower mounted amplifier filter according to claim 2, wherein each of the first tunable portion, the second tunable portion, and the third tunable portion comprises at least one tunable cavity filter.

4. The tower mounted amplifier filter according to claim 2, wherein at least one of:
the first frequency range is non-overlapping with the first pass band; and
each of the second frequency range and the third frequency range is non-overlapping with the second pass band.

5. The tower mounted amplifier filter according to claim 2, wherein the first tunable portion is tuned by a first tuning circuit, and the second tunable portion and the third tunable portion are tuned by a second tuning circuit.

6. The tower mounted amplifier filter according to claim 1, wherein each of the first tunable portion, the second tunable portion, and the third tunable portion comprises at least one tunable cavity filter.

7. The tower mounted amplifier filter according to claim 6, further comprising at least one common cavity that is shared by the transmission part and the reception part, and coupled to the first port.

8. The tower mounted amplifier filter according to claim 1, wherein at least one of:
the first frequency range is non-overlapping with the first pass band; and
each of the second frequency range and the third frequency range is non-overlapping with the second pass band.

9. The tower mounted amplifier filter according to claim 1, wherein the first tunable portion is tuned by a first tuning circuit, and the second tunable portion and the third tunable portion are tuned separately by a second tuning circuit.

10. The tower mounted amplifier filter according to claim 9, wherein each of the first tuning circuit and the second tuning circuit comprises at least one PIN diode.

11. A tower mounted amplifier, comprising:
a filter having:
a transmission part comprising a first tunable portion configured to operate in a first frequency range; and
a reception part comprising a second tunable portion configured to operate in a second frequency range and a third tunable portion configured to operate in a third frequency range;
a first port configured to connect to an external device;
a second port configured to connect to another external device;
a third port and a fourth port each configured to connect to an amplifier;
the transmission part being coupled between the first port and the second port;
the second tunable portion of the reception part being coupled between the first port and a third port; and
the third tunable portion of the reception part being coupled between the fourth port and the second port; and
a low noise amplifier connected between the third port and the fourth port;
the first tunable portion being configured to operate in a first frequency range different from a first pass band in which the second and third tunable portions are controlled to operate when a radio frequency signal is to be transmitted from the first port to the second port, such that the radio frequency signal is rejected by the first tunable portion; and
the second and third tunable portions are configured to operate respectively in a second frequency range and a third frequency range different from a second pass band in which the first tunable portion is controlled to operate when the radio frequency signal is to be transmitted from the second port to the first port, such that the radio frequency signal is rejected by the second tunable portion and the third tunable portion.

12. The tower mounted amplifier according to claim 11, wherein at least one of the transmission part and the reception part further comprises at least one fixed portion that cannot be electrically tuned.

13. The tower mounted amplifier according to claim 12, wherein each of the first tunable portion, the second tunable portion, and the third tunable portion comprises at least one tunable cavity filter.

14. The tower mounted amplifier according to claim 13, wherein at least one of:
the first frequency range is non-overlapping with the first pass band; and
each of the second frequency range and the third frequency range is non-overlapping with the second pass band.

15. The tower mounted amplifier according to claim 11, wherein each of the first tunable portion, the second tunable portion, and the third tunable portion comprises at least one tunable cavity filter.

16. The tower mounted amplifier according to claim 15, wherein the filter further comprises at least one common cavity that is shared by the transmission part and the reception part and coupled to the first port.

17. The tower mounted amplifier according to claim 11, wherein at least one of:
the first frequency range is non-overlapping with the first pass band; and
each of the second frequency range and the third frequency range is non-overlapping with the second pass band.

18. The tower mounted amplifier according to claim 11, wherein the first tunable portion is tuned by a first tuning circuit, and the second tunable portion and the third tunable portion are tuned by a second tuning circuit.

19. The tower mounted amplifier of claim 18, wherein each of the first tuning circuit and the second tuning circuit comprises at least one PIN diode.

20. The tower mounted amplifier of claim 18, wherein the first tuning circuit and the second tuning circuit are controlled by a control circuit comprising an envelope detector.

* * * * *